United States Patent
Butler et al.

(10) Patent No.: US 10,175,587 B2
(45) Date of Patent: Jan. 8, 2019

(54) LITHOGRAPHIC APPARATUS AND DEVICE MANUFACTURING METHOD

(71) Applicant: ASML Netherlands B.V., Veldhoven (NL)

(72) Inventors: Hans Butler, Best (NL); Marcus Joseph Elisabeth Godfried Breukers, Eindhoven (NL); Marcel François Heertjes, Best (NL)

(73) Assignee: ASML Netherlands B.V., Veldhoven (NL)

( * ) Notice: Subject to any disclaimer, the term of this patent is extended or adjusted under 35 U.S.C. 154(b) by 246 days.

(21) Appl. No.: 15/100,920

(22) PCT Filed: Nov. 21, 2014

(86) PCT No.: PCT/EP2014/075226
§ 371 (c)(1),
(2) Date: Jun. 1, 2016

(87) PCT Pub. No.: WO2015/090841
PCT Pub. Date: Jun. 25, 2015

(65) Prior Publication Data
US 2016/0299442 A1    Oct. 13, 2016

(30) Foreign Application Priority Data
Dec. 20, 2013 (EP) .................... 13198925

(51) Int. Cl.
*G03F 7/20* (2006.01)

(52) U.S. Cl.
CPC ...... *G03F 7/70775* (2013.01); *G03F 7/70725* (2013.01)

(58) Field of Classification Search
CPC .......... G03F 7/70725; G03F 7/70775
See application file for complete search history.

(56) References Cited

U.S. PATENT DOCUMENTS

| | | | |
|---|---|---|---|
| 5,699,145 A | 12/1997 | Makinouchi et al. | |
| 5,812,396 A * | 9/1998 | Kato | G03F 7/70691 700/56 |

(Continued)

FOREIGN PATENT DOCUMENTS

| | | |
|---|---|---|
| CN | 1441476 | 9/2003 |
| CN | 103135357 | 6/2013 |

(Continued)

OTHER PUBLICATIONS

Chinese Office Action dated Feb. 24, 2017 in corresponding Chinese Patent Application No. 201480069190.0.

(Continued)

*Primary Examiner* — Steven Whitesell Gordon
(74) *Attorney, Agent, or Firm* — Pillsbury Winthrop Shaw Pittman LLP

(57) ABSTRACT

A control device configured to determine a primary first drive signal, based on a first error signal representing a difference between desired and measured positions of a first body, for driving a positioner driving the first body; determine a primary second drive signal, based on a second error signal representing a difference between desired and measured positions of a second body, for driving a positioner driving the second body; determine, based on the second error signal, a secondary first drive signal for driving the first body positioner; determine, based on the first error signal, a secondary second drive signal for driving the second body positioner; combine the primary and secondary first drive signals and combine the primary and secondary second drive signals; and output the combined first and second drive signals to the respective positioning devices.

20 Claims, 7 Drawing Sheets

(56) References Cited

U.S. PATENT DOCUMENTS

| | | | |
|---|---|---|---|
| 6,373,072 | B1 | 4/2002 | Butler et al. |
| 6,975,383 | B2 | 12/2005 | Morisada |
| 7,084,958 | B2 | 8/2006 | Butler |
| 2003/0043354 | A1* | 3/2003 | Butler ................ G03F 7/70358 355/53 |
| 2003/0164930 | A1 | 9/2003 | Morisada |
| 2005/0231699 | A1 | 10/2005 | Butler |
| 2008/0109178 | A1 | 5/2008 | Sogard et al. |
| 2010/0188647 | A1 | 7/2010 | Yang et al. |
| 2010/0198371 | A1 | 8/2010 | Takagi |
| 2011/0090475 | A1* | 4/2011 | Fukagawa ........... G03F 7/70725 355/53 |

FOREIGN PATENT DOCUMENTS

| | | |
|---|---|---|
| JP | 8-241126 | 9/1996 |
| JP | 2000-000786 | 1/2000 |
| JP | 2000-31049 | 1/2000 |
| JP | 2003-249439 | 9/2003 |
| JP | 2005-51197 | 2/2005 |
| JP | 2005-303318 | 10/2005 |
| JP | 2011-86892 | 4/2011 |
| KR | 2000-0006321 | 1/2000 |
| KR | 2003-0070854 | 9/2003 |

OTHER PUBLICATIONS

Japanese Office Action dated Apr. 18, 2017 in corresponding Japanese Patent Application No. 2016-541564.
International Search Report and Written Opinion dated Mar. 5, 2015 in corresponding International Patent Application No. PCT/EP2014/075226.
Korean Office Action dated Nov. 21, 2017 in corresponding Korean Patent Application No. 10-2016-7018885.

* cited by examiner

LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2014/075226, which was filed on Nov. 21, 2014, which claims the benefit of priority of EP patent application no. 13198925.3, which was filed on Dec. 20, 2013 and which is incorporated herein in its entirety by reference.

BACKGROUND

Field of the Invention

The present invention relates to a control device for controlling a synchronous positioning of a multi-body system, a control method controlling a synchronous operation of a multi-body system, a lithographic apparatus and a method for manufacturing a device.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction.

During such synchronous scanning, a relative position between the target portion and the pattern should be in accordance with a desired position or set point, thus ensuring that the pattern is projected on the appropriate position on the substrate. If the pattern is not projected onto the appropriate position on the substrate, a so-called overlay error may occur, which may adversely affect the proper operation of the integrated circuit. Typically, the position of the substrate (comprising the target portion) and the patterning device is controlled by controlling the position of the supports (or stages) to which the substrate and patterning device are mounted. In general, a pair of separate closed loop controllers is applied for both controlling a set point to be followed by the stage provided with the patterning device (or reticle) and a set point to be followed by the stage provided with a substrate.

In such approach, both stages are independently controlled to each follow a particular set point, which set point is configured in such manner that the desired synchronous operation is achieved. In a more advanced control strategy (as e.g. described in U.S. Pat. No. 6,373,072), the control of both stages is coupled. In such coupled control strategy, a position error of the substrate stage (i.e. the stage provided with the substrate) may be used to derive a control signal for controlling a position of the reticle stage (i.e. the stage provided with the reticle), in addition to the reticle stage set point. In U.S. Pat. No. 6,373,072, such approach is referred to as a feedthrough method, whereby a position error of the substrate stage is fed through to the controller of the reticle stage.

SUMMARY

It is desirable to have an improved control strategy for controlling a synchronized operation of two or more bodies of a multi-body system. Therefore, according to a first aspect of the present invention, there is provided a control device for controlling a synchronous positioning of a multi-body system, the control device comprising:

an input for receiving a first error signal representing a difference between a desired position of a first body of the multi-body system and a measured position of the first body and a second error signal representing a difference between a desired position of a second body of the multi-body system and a measured position of the second body;

the control device being configured to:
 determine a primary first drive signal for driving a positioning device configured to drive the first body, based on the first error signal;
 determine a primary second drive signal for driving a positioning device configured to drive the second body, based on the second error signal;
 determine a secondary first drive signal for driving the positioning device configured to drive the first body, the secondary first drive signal being based on the second error signal; and
 determine a secondary second drive signal for driving the positioning device configured to drive the second body the secondary second drive signal being based on the first error signal.
 combine the primary first drive signal and the secondary first drive signal to obtain a combined first drive signal and combining the primary second drive signal and the secondary second drive signal to obtain a combined second drive signal;
the control device further comprising an output for outputting the combined first drive signal and the combined second drive signal to the respective positioning devices.

According to a second aspect of the present invention, there is provided a control method for controlling a synchronous operation of a multi-body system, the method comprising the steps of:

determining a first set point representing a desired position of a first body of the multi-body system and a second set point representing a desired set point of a second body of the multi-body system;

receiving a first error signal representing a difference between the desired position of the first body and a measured position of the first body and a second error signal representing a difference between the desired position of the second body and a measured position of the second body;

determining a primary first drive signal for driving a positioning device driving the first body based on the first error signal;

determining a primary second drive signal for driving a positioning device driving the second body based on the second error signal;

determining a secondary first drive signal for driving the positioning device driving the first body, the secondary first drive signal being based on the second error signal; and determining a secondary second drive signal for driving the positioning device driving the second body, the secondary second drive signal being based on the first error signal.

combining the primary first drive signal and the secondary first drive signal to obtain a combined first drive signal and combining the primary second drive signal and the secondary second drive signal to obtain a combined second drive signal;

providing the combined first drive signal and the combined second drive signal to the respective positioning devices.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
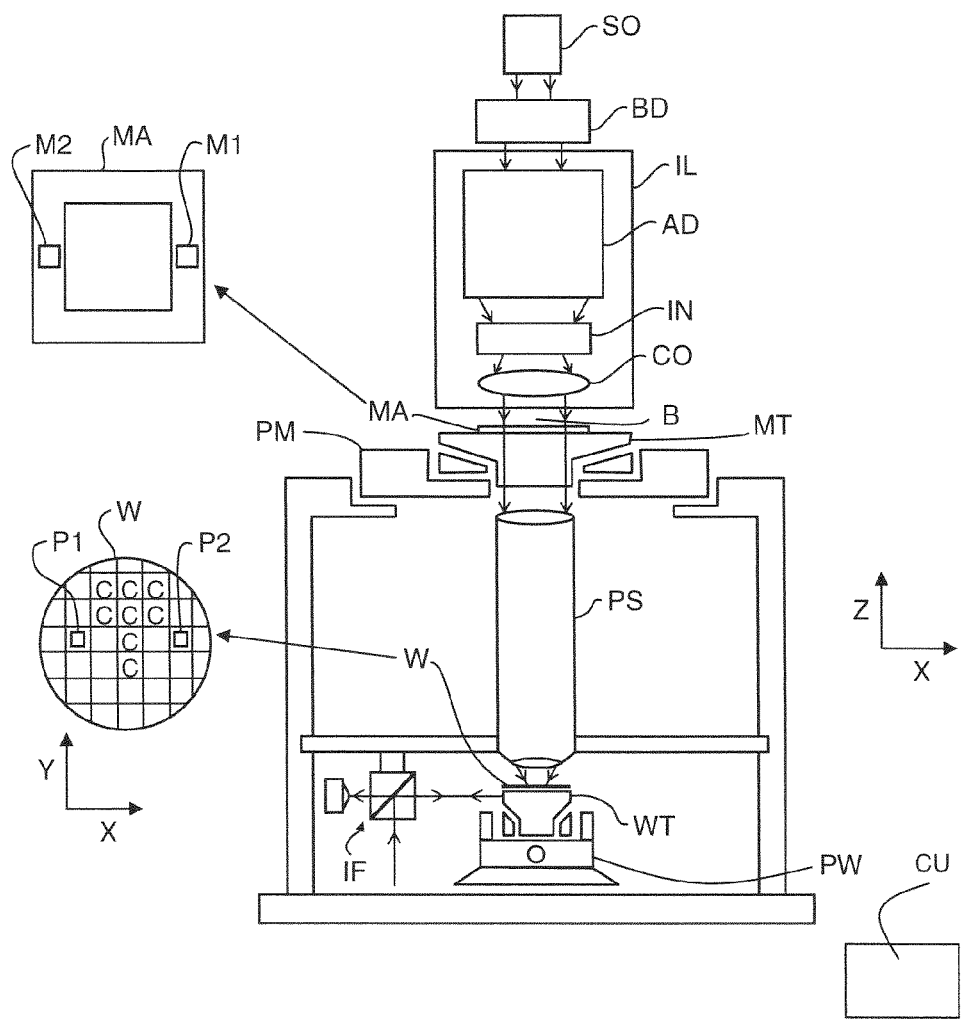
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable minor array employs a matrix arrangement of small minors, each of which can be individually tilted so as to reflect an incoming radiation beam in different directions. The tilted minors impart a pattern in a radiation beam which is reflected by the minor matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable minor array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. The lithographic apparatus further comprises a control device CU according to the present invention for controlling the synchronous displacement and positioning of at least the mask stage (provided with the mask table MT) and the substrate stage (provided with the substrate table WT). In an embodiment, the control device CU may however be configured to control a displacement or positioning of other parts or movable bodies of the apparatus as well. Other movable bodies in a lithographic apparatus may e.g. include optical components or devices such as lenses or minors or reticle masking blades. In this respect, it should be noted that, in accordance with the present invention, 'stage' may also be used to refer to a positioner or positioning device configured to position sensors or optical components (such as mirrors or lenses or masking blades). In case such sensors or components need to be displaced or positioned in synchronism with the substrate stage or the mask stage, a control device according to the present invention may be applied to control those stages as well. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable minor array of a type as referred to above.

Combinations and/or variations on the above described modes of use or entirely different modes of use may also be employed.

Figure 2:
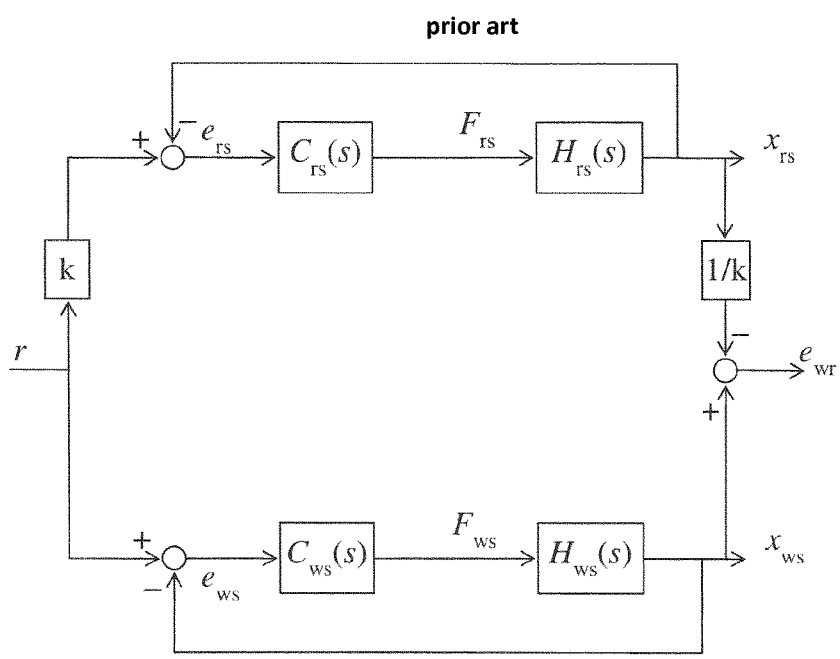
FIG. 2 depicts a control scheme as known in the art for controlling a synchronized positioning of a reticle stage and a substrate stage.

FIG. 2 schematically shows a control scheme as applied in a known lithographical apparatus for controlling a synchronous displacement of a reticle stage (or mask stage) and a wafer stage (or substrate stage).

In FIG. 2, r represents a desired trajectory or set point to be followed by a wafer stage (subscript ws). The reticle stage (subscript rs) needs to follow the trajectory r multiplied by a factor k (typically 4 or 5) to take a magnification of the projection system of the apparatus into account. The control scheme further shows a first controller C(s) for determining a drive signal $F_{rs}$ based on an error signal $e_{rs}$, the error signal $e_{rs}$ representing a difference between the desired position of the reticle stage and an actual measured position $x_{rs}$ of the reticle stage and a second controller $C_{ws}(s)$ for determining a drive signal $F_{ws}$ based on an error signal $e_{ws}$, the error signal $e_{ws}$ representing a difference between the desired position of the wafer stage and an actual measured position $x_{ws}$ of the wafer stage. In FIG. 2, $H_{rs}(s)$ and $H_{ws}(s)$ schematically represent a conversion of a respective driving force $F_{rs}$ and $F_{ws}$ to an actual position x and x of the reticle stage and the wafer stage. $H_{rs}(s)$ and $H_{ws}(s)$ may thus be considered as the mechanical transfer functions of the reticle stage and the wafer stage. FIG. 2 further shows the determination of a position error $e_{wr}$ between the reticle stage and the wafer stage, based on the actual positions $x_{rs}$ and $x_{ws}$ of the reticle stage and the wafer stage. In the control scheme of FIG. 2, both controllers $C_{rs}(s)$ and $C_{ws}(s)$ operate independent of each other, each determining a driving force ($F_{rs}/F_{ws}$) to reduce the position error of the respective stage.

Figure 3:
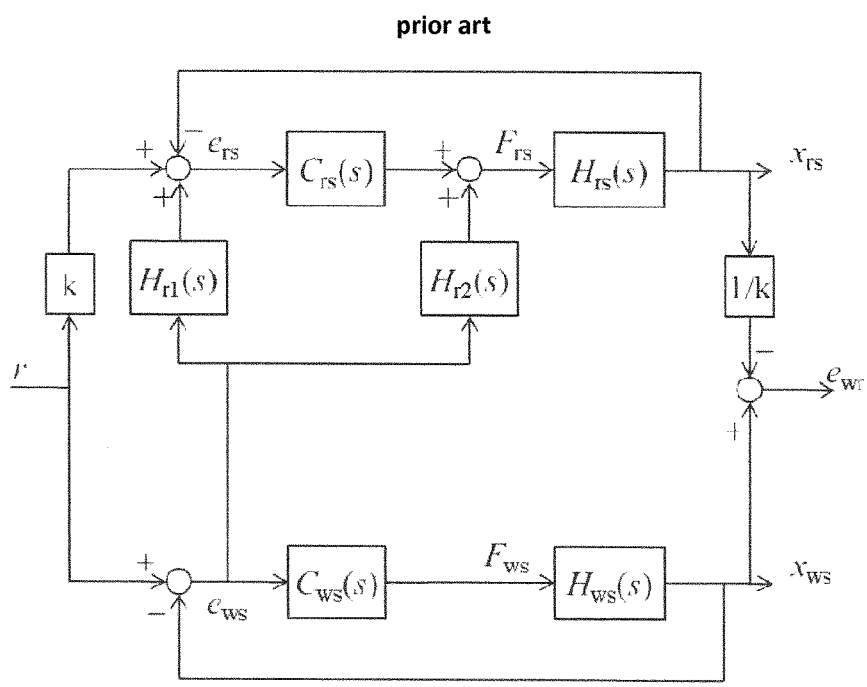
FIG. 3 depicts a further control scheme as known in the art, whereby an error feedthrough is applied from a substrate stage to a reticle stage.

In FIG. 3, another control scheme as applied in a known lithographical apparatus is schematically shown. The same symbols are used as in FIG. 2. In addition to the control scheme of FIG. 2, the control scheme of FIG. 3 further includes a so-called feedthrough path of the wafer stage position error to the reticle stage controller. Regarding this approach, reference can e.g. be made to U.S. Pat. No. 6,373,072. As can be seen in FIG. 3, the wafer stage error $e_{ws}$ is provided both as an input to controller $C_{rs}(s)$, via transfer function $H_{r1}(s)$, and as an additional driving force for controlling the reticle stage (represented by the transfer function $H_{rs}(s)$), via transfer function $H_{r2}(s)$. $H_{r2}(s)$ thus converts the wafer stage error $e_{ws}$ to an additional driving force. This may e.g. be realized by differentiating the error signal twice to obtain an acceleration error and multiplying the acceleration error with the mass M of the reticle stage, or $H_{r2}(s)=Ms^2$, s being the Laplace operator. The control scheme of FIG. 3 may advantageously be applied in case the response speed of the reticle stage is faster than that of the wafer stage. In such situation, feeding the wafer stage error to the reticle stage (i.e. the stage having the faster response), helps in reducing the error $e_{wr}$ which represents the position error between the reticle stage and the wafer stage, said error directly affecting the quality of the exposure process, i.e. the process whereby a pattern provided on a reticle that is mounted on the reticle stage is projected onto a target portion of a wafer that is mounted on the wafer stage.

The inventors of the present invention have devised a further improvement to the method as described in U.S. Pat. No. 6,373,072, whereby the present invention may be applied irrespective of whether there is a difference in the response speed or responsiveness between the stages or not. Typically, in known arrangements, the wafer stage may have a lower eigenfrequency than a reticle stage. As a result, a less aggressive control scheme needs to be adopted, resulting in a wafer stage being slower in responding to a disturbance or desired positioning.

Figure 4:
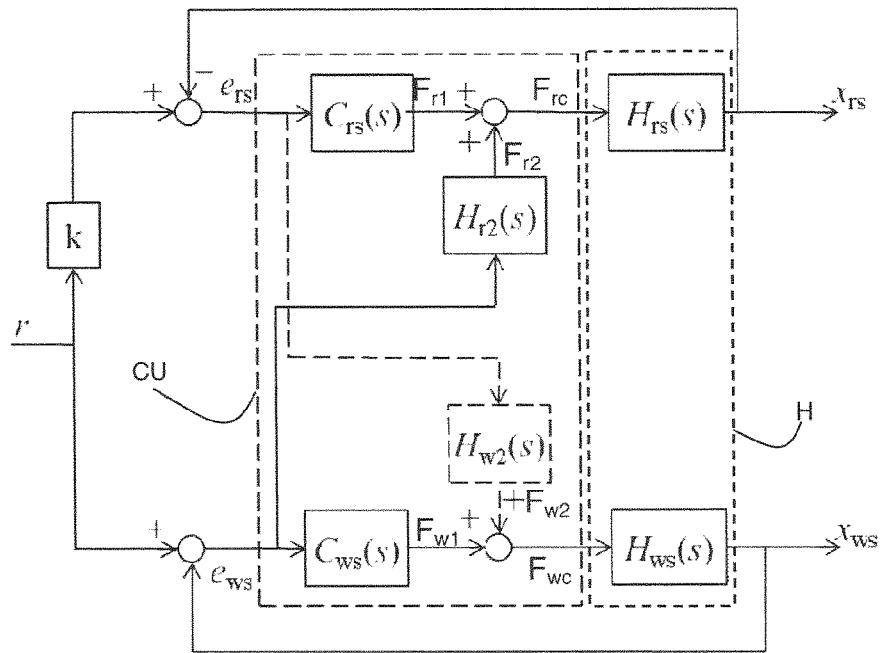
FIG. 4 depicts a first control scheme according to the present invention.

FIG. 4 schematically shows a first embodiment of a control device CU according to the present invention. FIG. 4 schematically shows a control scheme as can be applied to control a reticle stage and a wafer stage in a lithographic apparatus. It should be noted however that the control device CU as shown may also be applied to control a synchronous movement of other types of stages, in general, of other moving objects or bodies.

In the embodiment as shown, a set point or trajectory r represents a desired position of the wafer stage, whereas k times r represents a desired position of the reticle stage. In general, a predetermined relationship may exists between a desired position (or set point) of a first object or body and a desired position (or set point) of a second object or body. The control device CU is configured to receive, e.g. via an input terminal (not shown), a first error signal $e_{rs}$ representing a difference between the desired position of the reticle stage and a measured position $x_{rs}$ of the reticle stage and a second error signal $e_{ws}$ representing a difference between the desired position r of the wafer stage and a measured position $x_{ws}$ of the wafer stage. The control device CU comprises, similar to the arrangement shown in FIG. 2, a first controller $C_{rs}(s)$ for determining a primary drive signal ($F_{r1}$) based on the error signal $e_{rs}$ and a second controller $C_{ws}(s)$ for determining a primary drive signal ($F_{w1}$) based on the error signal $e_{ws}$. In an embodiment, the controllers $C_{rs}(s)$ and $C_{ws}(s)$ may e.g. comprise a PID controller or the like. In accordance with the present invention, a secondary drive signal is further provided for both stages. As can be seen, the control device CU is configured to determine a secondary drive signal $F_{r2}$ for the reticle stage based on the error signal $e_{ws}$ of the wafer stage and a secondary drive signal $F_{w2}$ for the wafer stage based on the error signal $e_{rs}$ of the reticle stage. The primary and secondary drive signals are combined to obtain combined drive signals $F_{rc}$ and $F_{wc}$ for respectively driving the reticle stage (represented by the mechanical transfer function $H_{rs}(s)$) and the wafer stage (represented by the mechanical transfer function $H_{ws}(s)$). The mechanical transfer functions represent a conversion from a drive signal or force to an actual position or displacement; i.e. they represent the actual behavior of the system H representing the wafer and reticle stage when a force ($F_{rc}$ or $F_{wc}$) are applied. The transfer functions as applied in the feedthrough paths, i.e. the feedthrough of the wafer stage error $e_{ws}$ and the reticle stage error $e_{rs}$, represent a conversion which is an inverse conversion as provided by the mechanical transfer functions; i.e. they represent a conversion from a position or displacement to a force (i.e. the secondary drive signals and $F_{r2}$ and $F_{w2}$). Ideally, in case the mechanical transfer functions would be known, these functions could be derived therefrom. In particular, in case $H_{r2}(s)=1/H_{rs}(s)$, the secondary drive signal $F_{r2}$ would correspond to the required reticle stage input to compensate for the wafer stage error $e_{ws}$. Similarly, by equating $H_{w2}(s)=1/H_{ws}(s)$, the secondary drive signal $F_{w2}$ would correspond to the required wafer stage input to compensate for the reticle stage error $e_{rs}$.

However, the actual mechanical behavior of the reticle stage and wafer stage is only known to a certain extent. In particular, the high frequency behavior of the stages may be difficult to predict or to be modelled accurately. When there is a discrepancy between the calculated compensation force $F_{r2}$ and the actual required force, this could result in an increased position error, instead of a reduced error. In order to avoid this, the transfer function $H_{r2}(s)$ preferably includes a low-pass filter (LPF), e.g. a low pass filter having a −4 or −2 gain. Similarly, the transfer function $H_{w2}(s)$ preferably also includes a low-pass filter (LPF) such as a low pass filter having a −4 or −2 gain. When such a compensating force ($F_{r2}$ and $F_{w2}$) is fed forward to the reticle stage and the wafer stage respectively, without any further measures, the first and second controllers $C_{rs}(s)$ and $C_{ws}(s)$ would consider this force as a disturbance and would react and try to diminish the effect of the feedforward force. As a result, the feedthrough of the secondary drive signals could become less effective. This effect can be avoided or mitigated by also feeding the position errors $e_{ws}$ and $e_{rs}$ to the respective controllers. In accordance with the present invention, various options exist for providing such a feedthrough of the position error of the stages.

Figure 5:
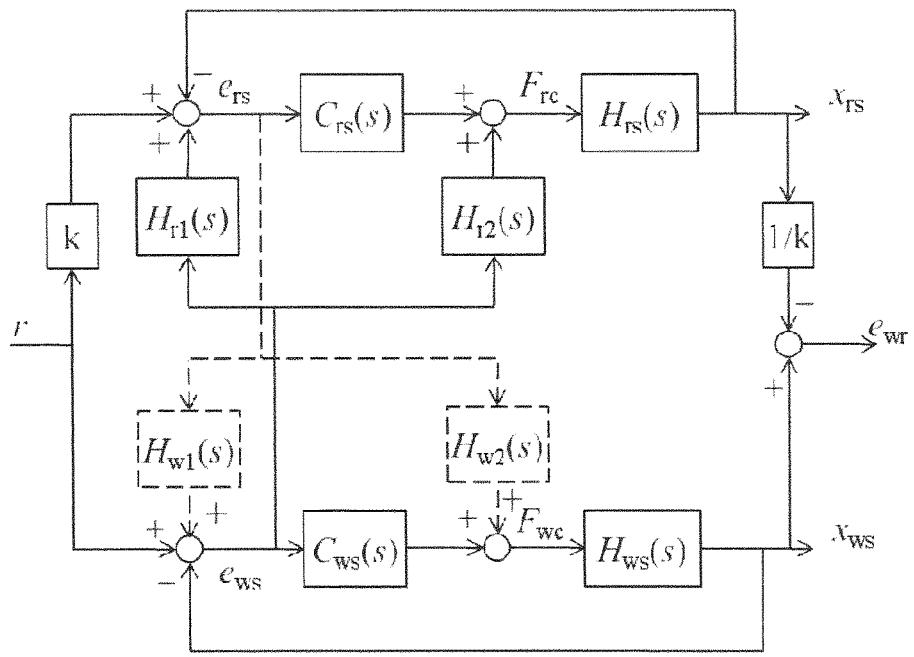
FIG. 5 depicts a second control scheme according to the present invention.

In a first embodiment, the controller input signal associated with the first stage is provided as input to the controller of the second stage and vice versa. Such an embodiment is schematically shown in FIG. 5. As can be seen, the error signal $e_{ws}$ is fed through via transfer function $H_{r1}(s)$ to the input of the reticle stage controller $C_{rs}(s)$. Similarly, the error signal $e_{rs}$ is fed through via transfer function $H_{w1}(s)$ to the input of the wafer stage controller $C_{ws}(s)$. Because this feedthrough is applied for both stages, an additional feedback loop has been created. In particular, the wafer stage controller $C_{ws}(s)$ now encounters a transfer function that is partly defined by the reticle stage closed loop. Similarly, the reticle stage controller $C_{rs}(s)$ now encounters a transfer function that is partly defined by the wafer stage closed loop.

Figure 6:
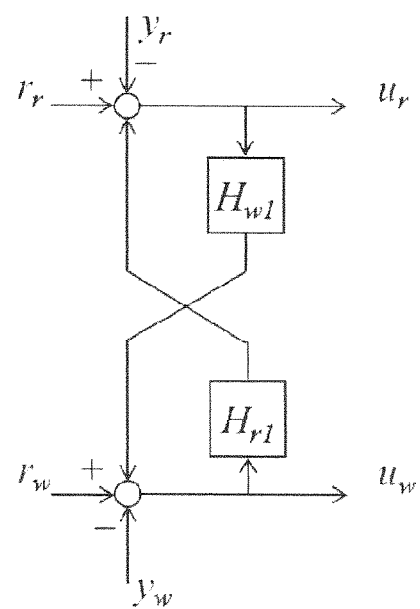
FIG. 6 depicts a detail of the second control scheme according to the present invention.

In FIG. 6, this is illustrated in a generalized form whereby $r_r$ and $r_w$ represent a set point (or desired position) of a reticle stage (subscript r) and a wafer stage (subscript w), $y_r$ and $y_w$ represent an actual position feedback signal obtained from the stages, $H_{w1}$ and $H_{r1}$ represent transfer functions as applied to feed the difference between the set point and the position feedback signal of one stage to the other stage, $u_r$ and $u_w$ representing the resulting input signal as applied to a controller (not shown) of the stages. For the arrangement as depicted, one can derive the following expression for $u_r$.

$$u_r = \frac{1}{1 - H_{w1}H_{r1}}[(r_r - y_r) + H_{r1}(r_w - y_w)] \quad (1)$$

As can be seen, the reticle stage controller receives, as an input, a signal $u_r$ that is a function of $H_{w1}$. Similar observations can be made regarding the input signal $u_w$ for the wafer stage controller. Referring back to FIG. 5, both errors $e_{ws}$ and $e_{rs}$ are thus fed through to the respective controllers $C_{rs}(s)$ and $C_{ws}(s)$ using transfer functions $H_{r1}(s)$ and $H_{w1}(s)$ in a manner as shown in FIG. 6. In an embodiment, transfer functions $H_{r1}(s)$ and $H_{w1}(s)$ are low-pass filters. From (1) it follows that if $H_{r1}(s)H_{w1}(s)$ is close to 1 a stability risk occurs.

In an embodiment, $H_{r1}(s)$ and $H_{r2}(s)$ may comprise the same LPF. Similarly, $H_{w1}(s)$ and $H_{w2}(s)$ may comprise the same LPF.

Figure 7:
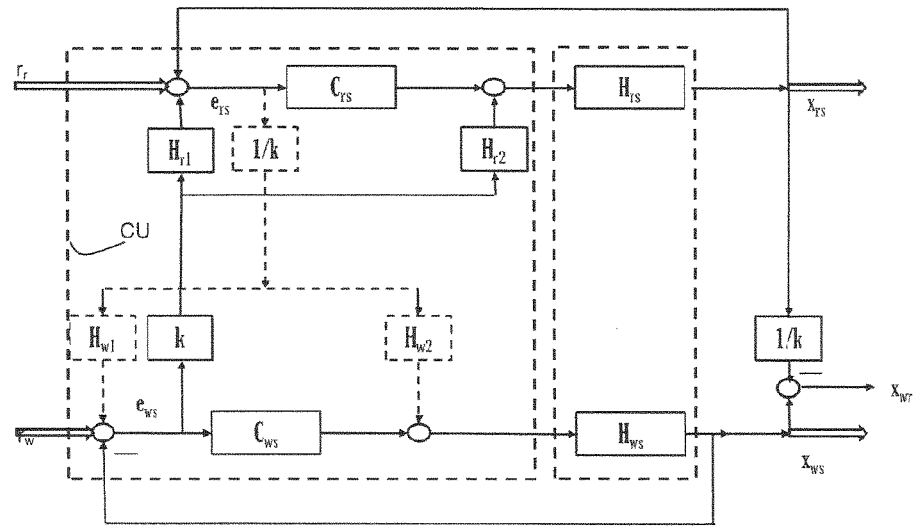
FIG. 7 depicts an alternative model of the second control scheme according to the present invention.

Due to the particular feedthrough of both errors as shown in FIG. 5, care should be taken to ensure the stability of the control loops. In order to assess the stability, the following can be considered. The control device CU and the system H as shown in FIG. 5 can be considered a respective MIMO (multiple input/multiple output) controller controlling a SISO (single input/single output) system. Such a system, whereby a feedthrough as shown in FIG. 5 is applied, may also be depicted as shown in FIG. 7. FIG. 7 schematically shows a system having two position input signals $r_w$ (e.g. a wafer stage set point) and $r_r$ (e.g. a reticle stage set point, possibly equal to $k \times r_w$) and a control device CU having a similar error feedthrough as shown in FIG. 5. Compared to FIG. 5, the factors k and 1/k which take into account a magnification of the projection system, are being made more explicit. The open loop behavior of the shown system can be expressed by the following equation:

$$C \cdot P = \begin{bmatrix} C_{rs} & kC_{rs}H_{r1} + kH_{r2} \\ \frac{1}{k}C_{ws}H_{w1} + \frac{1}{k}H_{w2} & C_{ws} \end{bmatrix} \begin{bmatrix} H_{rs} & 0 \\ 0 & H_{ws} \end{bmatrix} \quad (2)$$

The stability of the MIMO system can be assessed by considering the determinant of (I+C·P), I being the unity matrix. In order for the system to be stable, the following condition has to be met:

$$\det(I+C \cdot P) < > 0 \quad (3)$$

or $$(C_{ws}H_{ws}+1)(C_{rs}H_{rs}+1)-(C_{ws}H_{ws}H_{w1}+H_{w2}H_{ws})(C_{rs}H_{rs}H_{r1}+H_{r2}H_{rs}) < > 0 \quad (4)$$

As mentioned above, when a secondary drive signal ($F_{r2}$ or $F_{w2}$) is determined, based on the position errors $e_{ws}$ or $e_{rs}$ (see FIG. 5), transfer functions $H_{r2}$ and $H_{w2}$ are applied, which, ideally, should be the inverse of $H_{rs}$ and $H_{ws}$ respectively. In practice, the transfer functions $H_{r2}$ and $H_{w2}$ can be described, in an embodiment, as a combination of a low-pass filter (LPF) and a model approximating the inverse mechanical transfer functions $H_{rs}$ and $H_{ws}$. $H_{r1}$ and $H_{w1}$ can be described, in an embodiment, as low-pass filters. So, in below stability considerations, $H_{r2}$, $H_{w2}$, $H_{r1}$ and $H_{w1}$ are thus described as:

$$H_{r2} = \alpha \frac{LPF_r}{\tilde{H}rs},$$

$$H_{w2} = \beta \frac{LPF_w}{\tilde{H}ws},$$

$$H_{w1} = \beta \cdot LPF_w,$$

$$H_{r1} = \alpha \cdot LPF_r \quad (5)$$

Wherein:

Coefficients $\alpha$ and $\beta$ represent the amplification or gain of the feedthrough, LPFr and LPFw are the low-pass filters as applied in the feedthrough paths of the reticle stage and wafer stage, $\tilde{H}rs$ and $\tilde{H}ws$ represent the approximate models of the mechanical transfer functions $H_{rs}(s)$ and $H_{ws}(s)$ as shown in FIG. 5. As a first approximation, the transfer functions $\tilde{H}rs$ and $\tilde{H}ws$ can e.g. comprise a double differentiation and a multiplication with the reticle stage mass and wafer stage mass respectively.

When equations (5) are applied in equation (4), the stability condition becomes:

$$(C_{ws}H_{ws} + 1)(C_{rs}H_{rs} + 1) - \quad (6)$$

$$\alpha \cdot \beta \cdot LPF_r \cdot LPF_w \left( C_{ws}H_{ws} + \frac{H_{ws}}{\tilde{H}ws} \right) \left( C_{rs}H_{rs} + \frac{H_{rs}}{\tilde{H}rs} \right) < > 0$$

To ensure in practice that this condition is met, a distinction can be made between a low frequency range and a high frequency range.

At low frequencies, it can be assumed that the models $\tilde{H}rs$ and $\tilde{H}ws$ accurately represent the approximate models of the mechanical transfer functions Hrs(s) and Hws(s) and so:

$$\frac{H_{ws}}{\tilde{H}ws} == 1 \text{ and } \frac{H_{rs}}{\tilde{H}rs} == 1. \quad (7)$$

Further considering that $LPF_r$ and $LPF_w=1$ at low frequencies, results in a condition to be met:

$$\alpha \cdot \beta < 1 \quad (8)$$

to ensure stability.

At higher frequencies, in particular at resonance frequencies, the following could be observed:

$$\frac{H_{ws}}{\tilde{H}_{ws}} > 1 \text{ and } \frac{H_{rs}}{\tilde{H}_{rs}} > 1 \quad (9)$$

At such frequencies, one can ensure that:
$\alpha \cdot \beta \cdot LPF_r \cdot LPF_w \ll 1$, by appropriate selection of the filters $LPF_r$ and $LPF_w$.

In has been found that a selection of $\alpha=\beta=0.8$ and LPFs having a −2 gain are sufficient to ensure stability of the system described in FIGS. 5 and 7. As an example of an LPF as can be applied, an LPF having a cut-off frequency in a range of 500-1500 Hz can be mentioned. As a particular example, an LPF having a cut-off frequency of 600 Hz could be applied in case a reticle stage having a first eigenfrequency of approx. 1800 Hz is controlled.

Note that, due to the feedthrough of the position errors of both the wafer stage and the reticle stage as described in FIGS. 5-7 the error signals as fed through via transfer functions $H_{r1}(s)$ and $H_{w1}(s)$ are no longer solely reticle stage errors or wafer stage errors. In particular, as can e.g. be seen from FIG. 5, the error signal $e_{rs}$ (which is applied via the transfer function $H_{w1}(s)$ to the wafer stage controller) also comprises a component based on $e_{ws}$, which comprises the wafer stage error.

Figure 8:
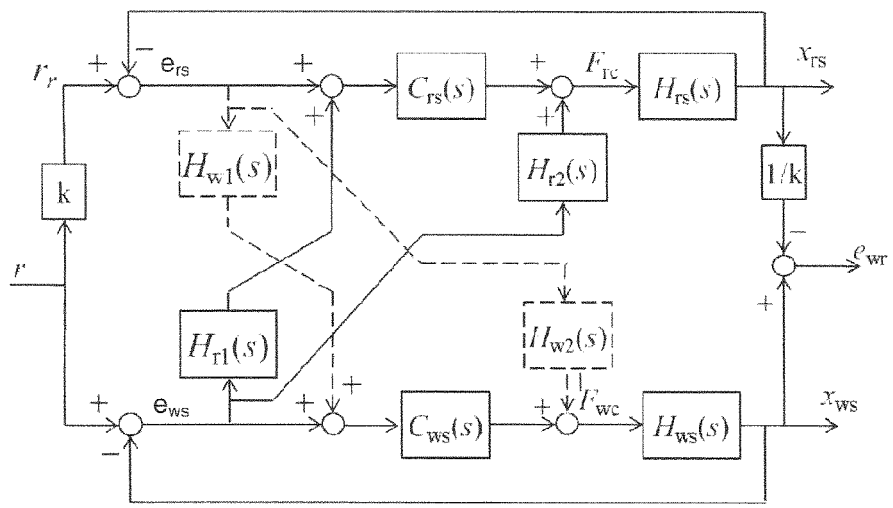
FIG. 8 depicts a third control scheme according to the present invention.

In order to avoid this, an embodiment of the present invention provides in an alternative feedthrough of the position error of one stage to the other stage. Such an arrangement is schematically shown in FIG. 8.

Compared to FIG. 5, one can see that only the actual reticle stage error $e_{rs}$ (i.e. the difference between $r_r$ and $x_{rs}$) is fed through (via transfer function $H_{w1}(s)$), whereas in FIG. 5, $e_{rs}$ also contained the transferred wafer stage error $e_{ws}$.

Figure 9:
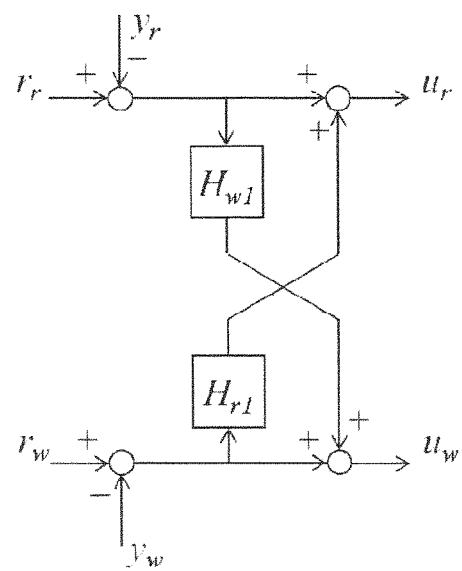
FIG. 9 depicts a detail of the third control scheme according to the present invention.

By doing so, the cross-linkage between the wafer stage control loop and the reticle stage control loop is reduced. FIG. 9 schematically shows, in a similar manner as FIG. 6, a generalized form of such feedthrough, whereby the signal $u_r$ may be determined as:

$$u_r = [(r_r - y_r) + H_{r1}(r_w - y_w)] \quad (10)$$

As can be seen, using the arrangement of FIG. 9, the signal $u_r$ is no longer a function of the transfer function $H_{w1}(s)$, but is merely a function of the reticle stage error and the fed through wafer stage error. As further can be seen, the stability risk when $H_{r1}(s)H_{w1}(s)$ is close to 1 (see equation 1) is reduced.

Figure 10:
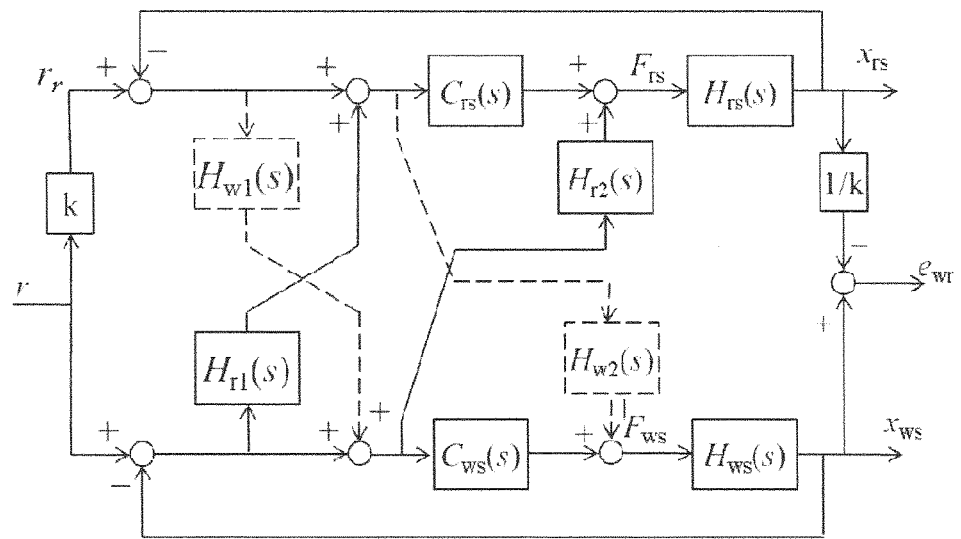
FIG. 10 depicts a fourth control scheme according to the present invention.

In FIG. 10, a fourth embodiment of a control scheme according to an embodiment of the present invention is schematically shown. Compared to the embodiment of FIG. 8, the following can be noted:

With respect to the feedthrough of the error components to the controllers, the arrangement of FIG. 10 corresponds to the arrangement of FIG. 8, i.e. the actual reticle stage error $e_{rs}$ (i.e. the difference between $r_r$ and $x_{rs}$) is fed through (via transfer function $H_{w1}(s)$) to the wafer stage controller $C_{ws}(s)$ of the wafer stage whereas in FIG. 5, $e_{rs}$ also contained the transferred wafer stage error $e_{ws}$. Similarly, the actual wafer stage error $e_{ws}$ (i.e. the difference between $r_w$ and $x_{ws}$) is fed through (via transfer function $H_{r1}(s)$) to the reticle stage controller $C_{rs}(s)$.

With respect to the feedthrough forces, i.e. via transfer functions $H_{r2}(s)$ and $H_{w2}(s)$, one can see that the arrangement of FIG. 10 corresponds to the arrangement of FIG. 5, whereby the feedthrough forces are based on the input signal of the controllers $C_{ws}(s)$ and $C_{rs}(s)$.

With respect to the assessment of the stability of the control schemes according to the present invention, i.e. control schemes having bi-direction feedthrough, the following can be mentioned. The control methods according to the present invention provide in an improvement of the positional error observed between two or more stages or bodies or objects that need to operate in synchronism, when compared to the known method of FIG. 3. The stability of the known system can be assessed in a similar manner as described above, see equation 3, when considering the controllers $C_{ws}(s)$ and $C_{rs}(s)$ of FIG. 3 and the stage system comprising the reticle stage transfer function $H_{rs}(s)$ and the wafer stage transfer function $H_{ws}(s)$ as a respective MIMO (multiple input/multiple output) controller and a SISO (single input/single output) system. Determining C·P for this system results in:

$$C \cdot P = \begin{bmatrix} C_{rs}(s) & kC_{rs}(s)H_{r1}(s) + kH_{r2}(s) \\ 0 & C_{ws}(s) \end{bmatrix} \cdot \begin{bmatrix} H_{rs}(s) \\ H_{ws}(s) \end{bmatrix} \quad (11)$$

$$= \begin{bmatrix} C_{rs}(s)H_{rs}(s) & (kC_{rs}(s)H_{r1}(s) + kH_{r2}(s))H_{ws}(s) \\ 0 & C_{ws}(s)H_{ws}(s) \end{bmatrix}$$

Because of the upper diagonal structure, the MIMO stability is essentially obtained when the SISO transfer functions $C_{ws}(s)H_{ws}(s)$ and $C_{rs}(s)H_{rs}(s)$ are stable. As such, when applying only a single feedthrough, as e.g. done in the control scheme of FIG. 3, there are no additional considerations required for the stability of the system, in case the SISO transfers are stable. Phrased differently, the closed-loop stability can be considered independent of the feedthrough controller $kC_{rs}(s)H_{r1}(s) + kH_{r2}(s)$ in equation (11). However, in case of a bi-directional feedthrough, as applied in the present invention, the element below the diagonal of the controller matrix C becomes non-zero, see e.g. equation (2) where C·P is calculated for the configuration of FIG. 7. Note that a similar determination of C·P can be made for the configurations of FIGS. 8 and 10 as well. Given this insight, the inventors of the present invention have thus devised that, in order to ensure stability of a MIMO system having a bi-directional feedthrough, one should focus to ensure that the elements of the controller matrix below the diagonal are sufficiently small. In practice, this can be realized by applying the appropriate filtering, as e.g. illustrated in equations (3)-(9) for the embodiment of FIG. 7. With respect to this and other embodiments, other types of filtering, e.g. including notch filters or the like may be considered as well. So, generalizing, when the SISO transfers (i.e. the diagonal elements of the C·P-matrix) are stable, an appropriate filtering of the non-diagonal elements can ensure that the bi-directional feedthrough results in a stable control. The control method or control device according to the present invention, enables a position error between two or more stages that need to operate in synchronism to be reduced. In particular, the application of the methods according to the invention in a lithographic apparatus have been found to significantly reduce the moving average (MA) error between a reticle stage and a wafer stage. At the same time, the moving standard deviation (MSD) error has been found to remain unaffected or slightly improved.

Although the description above primary describes a synchronous operation of a reticle stage and a wafer stage in a lithographic apparatus, the invention may also be applied to improve a synchronised operation of more than two stages and may also be applied outside the field of lithography. As an example of the former, the control device or control method according to the present invention may also be used to control other stages in a lithographic apparatus, such as stages controlling the position of an optical element or device in the apparatus. As an example, a lithographic apparatus may also include optical components such as lenses or mirrors or masking blades that need to be positioned, e.g. in synchronism with a stage.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A control device configured to control a synchronous positioning of a multi-body system, the control device comprising:
   an input configured to receive a first error signal representing a difference between a desired position of a first body of the multi-body system and a measured position of the first body, and a second error signal representing a difference between a desired position of a second body of the multi-body system and a measured position of the second body;
   the control device being configured to:
      determine, based on the first error signal, a primary first drive signal for driving a positioning device configured to drive the first body,
      determine, based on the second error signal, a primary second drive signal for driving a positioning device configured to drive the second body,
      determine, using a first transfer function, a secondary first drive signal for driving the positioning device configured to drive the first body, the secondary first drive signal being based on the second error signal,
      determine, using a second transfer function different from the first transfer function, a secondary second drive signal for driving the positioning device configured to drive the second body, the secondary second drive signal being based on the first error signal, and
      combine the primary first drive signal and the secondary first drive signal to obtain a combined first drive signal and combining the primary second drive signal and the secondary second drive signal to obtain a combined second drive signal; and
   the control device further comprising an output configured to output the combined first drive signal and the combined second drive signal to the respective positioning devices.

2. The control device according to claim 1, wherein the first transfer function includes a model providing a position-to-force conversion for the first body; and wherein the second transfer function includes a model providing a position-to-force conversion for the second body.

3. The control device according to claim 1, wherein the first transfer function includes a first low-pass filter and wherein the second transfer function includes a second low-pass filter.

4. The control device according to claim 3, wherein a gain of the first low-pass filter multiplied with a gain of the second low-pass filter is less than 1.

5. The control device according to claim 3, wherein the gain of the first low-pass filter is less than or equal to 0.8 and wherein the gain of the second low-pass filter is less than or equal to 0.8.

6. The control device according to claim 1, wherein the primary first drive signal is further determined based on a first feedthrough signal, the first feedthrough signal being based on the second error signal and wherein the primary second drive signal is further determined based on a second feedthrough signal, the second feedthrough signal being based on the first error signal.

7. The control device according to claim 6, wherein the first feedthrough signal is obtained by a low-pass filtering, using a first low-pass filter, of the second error signal and wherein the second feedthrough signal is obtained by a low-pass filtering, using a second low-pass filter, of the first error signal.

8. The control device according to claim 6, wherein the first feedthrough signal is based on the second error signal prior to combination of the second error signal with the second feedthrough signal for determining the primary second drive signal and the second feedthrough signal is based on the first error signal prior to combination of the first error signal with the first feedthrough signal for determining the primary first drive signal.

9. The control device according to claim 6, wherein the secondary first drive signal is based on the second error signal after it is combined with the second feedthrough signal and the secondary second drive signal is based on the first error signal after it is combined with the first feedthrough signal.

10. The control device according to claim 1, wherein the secondary first drive signal is further based on the first error signal and wherein the secondary second drive signal is further based on the second error signal.

11. A multi-stage positioning system configured to perform a synchronous positioning of at least a first stage and a second stage, the multi-stage positioning system comprising:
a first stage configured to hold a first object; the first stage comprising a positioning device configured to drive the first object;
a second stage configured to hold a second object, the second stage comprising a positioning device configured to drive the second object; and
a control device according to claim 1 configured to control a synchronous positioning of the first object and the second object.

12. A lithographic apparatus comprising:
an illumination system configured to condition a radiation beam;
a first stage constructed to support a patterning device, the patterning device being capable of imparting the radiation beam with a pattern in its cross-section to form a patterned radiation beam;
a second stage constructed to hold a substrate;
a projection system configured to project the patterned radiation beam onto a target portion of the substrate; and
a control device according to claim 1 configured to control synchronous positioning of the first and second stages.

13. A device manufacturing method comprising transferring a pattern from a patterning device onto a substrate, using a lithographic apparatus according to claim 12.

14. A control method to control a synchronous operation of a multi-body system, the method comprising:
determining a first set point representing a desired position of a first body of the multi-body system, and a second set point representing a desired set point of a second body of the multi-body system;
receiving a first error signal representing a difference between the desired position of the first body and a measured position of the first body, and a second error signal representing a difference between the desired position of the second body and a measured position of the second body;
determining a primary first drive signal for driving a positioning device driving the first body based on the first error signal;
determining a primary second drive signal for driving a positioning device driving the second body based on the second error signal;
determining, using a first transfer function, a secondary first drive signal for driving the positioning device driving the first body, the secondary first drive signal being based on the second error signal;
determining, using a second transfer function different from the first transfer function, a secondary second drive signal for driving the positioning device driving the second body, the secondary second drive signal being based on the first error signal;
combining the primary first drive signal and the secondary first drive signal to obtain a combined first drive signal and combining the primary second drive signal and the secondary second drive signal to obtain a combined second drive signal; and
providing the combined first drive signal and the combined second drive signal to the respective positioning devices.

15. The method according to claim 14, wherein the first transfer function includes a first low-pass filter and wherein the second transfer function includes a second low-pass filter.

16. The method according to claim 15, wherein a gain of the first low-pass filter multiplied with a gain of the second low-pass filter is less than 1.

17. The method according to claim 15, wherein the gain of the first low-pass filter is less than or equal to 0.8 and wherein the gain of the second low-pass filter is less than or equal to 0.8.

18. The method according to claim 14, further determining the primary first drive signal based on a first feedthrough signal, the first feedthrough signal being based on the second error signal and further determining the primary second drive signal based on a second feedthrough signal, the second feedthrough signal being based on the first error signal.

19. The method according to claim 18, wherein the first feedthrough signal is obtained by a low-pass filtering, using a first low-pass filter, of the second error signal and wherein the second feedthrough signal is obtained by a low-pass filtering, using a second low-pass filter, of the first error signal.

20. The method according to claim 18, wherein the first feedthrough signal is based on the second error signal prior to combination of the second error signal with the second feedthrough signal for determining the primary second drive signal and the second feedthrough signal is based on the first error signal prior to combination of the first error signal with the first feedthrough signal for determining the primary first drive signal.

* * * * *